United States Patent [19]
Iketsu

[11] Patent Number: 6,078,138
[45] Date of Patent: Jun. 20, 2000

[54] ORGANIC THIN FILM ELECTROLUMINESCENCE DISPLAY UNIT

[75] Inventor: Yuichi Iketsu, Tokyo, Japan

[73] Assignee: NEC Corporation, Tokyo, Japan

[21] Appl. No.: 08/806,477

[22] Filed: Feb. 26, 1997

[30] Foreign Application Priority Data

Feb. 28, 1996 [JP] Japan ................................ 8-041050

[51] Int. Cl.[7] ...................................................... H01J 1/62
[52] U.S. Cl. ........................................... 313/504; 313/505
[58] Field of Search ................................... 313/504, 505, 313/508, 509, 113, 114

[56] References Cited

U.S. PATENT DOCUMENTS

| | | | |
|---|---|---|---|
| 5,302,468 | 4/1994 | Namiki et al. | 313/505 |
| 5,521,465 | 5/1996 | Budzilek et al. | 313/505 |
| 5,693,962 | 12/1997 | Shi et al. | 313/505 |
| 5,705,888 | 1/1998 | Staring et al. | 313/504 |

FOREIGN PATENT DOCUMENTS

| | | |
|---|---|---|
| 56-62284 | 5/1981 | Japan . |
| 57-51781 | 3/1982 | Japan . |
| 5121172 | 5/1993 | Japan . |
| 06314594A | 11/1994 | Japan . |
| 07078690A | 3/1995 | Japan . |
| 07142169A | 6/1995 | Japan . |

OTHER PUBLICATIONS

C. Adachi et al, "Organic electroluminescent device having a hole conductor as an emitting layer", *Appl. Phys. Lett.*, 55(15), Oct. 9, 1989, pp. 1489–1491.

*Primary Examiner*—Nimeshkumar D. Patel
*Assistant Examiner*—Todd Reed Hopper
*Attorney, Agent, or Firm*—Sughrue, Mion, Zinn, Macpeak & Seas, PLLC

[57] ABSTRACT

A two-dimensional organic thin film electroluminescence (EL) display unit has a plurality of one-dimensional organic EL arrays extending in a first direction and adhered together in a second direction perpendicular to the first direction. The EL array has a transparent substrate having a main surface directed to the second direction, and a multilayer EL structure formed on the main surface and including a plurality of first layer transparent electrodes extending perpendicular to the array, an organic EL thin film and a second layer metallic electrode extending along the array. The EL array emits luminescence in the third direction perpendicular to the first and second directions. The first layer electrodes and the second layer electrode drive the EL array in a matrix drive. The organic EL display unit exhibits excellent image quality, contrast and brightness.

10 Claims, 5 Drawing Sheets

ORGANIC THIN FILM ELECTROLUMINESCENCE DISPLAY UNIT

BACKGROUND OF THE INVENTION (a) Field of the Invention

The present invention relates to an organic thin film electroluminescence (EL) display unit and, more particularly, to a two-dimensional organic thin film EL display unit capable of being driven by a pair of electrodes.

(b) Description of the Related Art

Some organic thin films are known to have an EL effect when the organic thin films are interposed between two electrodes, i.e., between an anode and a cathode. In these organic thin films, holes and electrons injected from the electrodes are recombined to provide an energy for generating luminescence based on the EL phenomenon. This EL phenomenon is generally called "organic thin film EL" and being developed by active researches for a display unit because of its higher energy efficiency and a lower voltage driving capability, as compared to other display devices. The organic EL display unit can be driven by a direct current as low as at several volts to several tens of volts.

The organic thin film EL phenomenon can be observed even in a single organic EL thin film. To obtain a high energy luminance at a lower applied voltage, it is desirable to improve the injection efficiency of the carriers injected into the organic EL film from each electrode. For this purpose, a multilayer structure including a carrier injection layer or carrier transport layer interposed between the electrode and organic EL thin film is proposed in some literatures, in order to reduce the energy barrier between the electrode and the organic EL thin film to thereby enhance mobility of the carriers between the electrode and the organic EL thin film.

Examples of the literatures include: Patent Publication No. JP-A-1982-51781 which proposes a multilayer structure of anode/organic hole transport layer/organic EL thin film/cathode; Appl. Phys. Lett. 55, 1489 (1989) presented by Adachi et al. and entitled Organic electroluminescent device having a hole conductor as an emitting layer which proposes another multilayer structure of anode/organic EL thin film/organic electron transport layer/cathode; and Patent Publication No. JP-A-1994-314594 which proposes another multilayer structure of anode/a plurality of organic hole injection and transport layers/organic EL thin film/a plurality of organic electron injection and transport layers/cathode. The order of the films in these multilayer structures may be reversed from the recited orders.

FIG. 1 shows one of the conventional multilayer structures as mentioned above, which includes anode 41/organic hole transport layer 42/organic EL thin film 43/cathode 44 consecutively formed on a supporting substrate 40. Materials for at least one of the electrodes should be transparent for emission of the generated luminescence, and indium-tin-oxide (ITO) is generally used as the material for the anode 41 for this purpose. Materials for the cathode 44 is selected from metals such as Mg, Al and In, which have a low work function for reducing barrier for the injected electrons, and which may or may not be doped with Ag or Li, as described in Patent Publication No. JP-A-1993-121172, for example.

Materials for the organic hole transport layer 42 can be selected from aromatic tertiary amine, porphyrin derivatives etc. and material for the organic EL thin film 43 can be selected from 8-hydroxy quinoline metallic complex, butadiene derivatives, coumalin derivatives, benzoxazole derivatives, oxadiazole derivatives, oxazole derivatives, thiadiazole derivatives, styreneamine derivatives, bisstyrylbenzen derivatives, bis-styrylanthracene derivatives, perylene derivatives, aminopyrene derivatives, etc. Material for the organic electron transport layer, if provided, can be selected from naphtalimide derivatives, perylene tetracarbon acid diimide derivatives, quinacridone derivatives etc. The electrodes 41 and 44 and organic thin films 42 and 43 are consecutively formed on the supporting substrate 40, such as glass or resin film, by a dry deposition method, such as vacuum evaporation or sputtering, or a wet deposition method, such as spin-coating or dipping in a solution wherein the above mentioned materials are dispersed or dissolved in a resin or solvent. When a transparent electrode is formed as a first layer electrode 41, the supporting substrate 40 should be also transparent for emission of the luminescence.

A two-dimensional luminescent display unit using the organic thin film EL is proposed wherein a plurality of unit pixels or EL cells each formed by the organic thin film EL multilayer structure as described above are arranged on a supporting substrate in a two-dimensional array (see, for example, Patent Publication No. JP-A-1995-78690). FIG. 2 shows the proposed two-dimensional display unit, wherein a plurality of first layer stripe electrodes 41a extending parallel to one another, an organic multilayer structure 43b including at least one organic EL thin film and a plurality of second layer stripe electrodes 44a extending perpendicular to the first layer stripe electrodes 41a and parallel to one another are consecutively formed on a supporting substrate 40. The crossing portions of the first layer electrodes 41a and the second layer electrodes 44a constitute EL cells arranged in a two-dimensional array and driven by the pair of electrode groups 41a and 44a in a matrix drive.

The two-dimensional EL display unit as described above, however, suffers from degradation in the image quality when the EL cells have scattering or variation of luminescence or defects in some cells because the luminescence are generally observed from the front to thereby emphasize the defects. In addition, since one of the first and second layer electrode groups 41a and 44a is transparent and the other is metallic, the EL device has a poor contrast due to the reflection of external light by the metallic electrodes in the cells which are not luminous at that instant, the metallic electrodes being disposed behind the screen.

Further, patterning by use of a known photolithographic technique is difficult to apply to the organic EL materials because the EL materials have generally insufficient resistance to acidic or alkali solution or organic solvent, which are essential to the process in fabrication of the EL display unit. Especially, for a color display unit, a variety of organic EL materials are used for imaging different colors, some of which may have insufficient resistance. Patent Publication No. JP-A-1995-142169 proposes the solution for this problem, wherein a multilayer structure including organic EL thin films for generating three primary colors is interposed between the anode and cathode to generate white luminescence, which is then filtered by a color filter such as used in a liquid crystal display device. The solution, however, has disadvantages in that the drive voltage requested for driving the organic EL thin film generally rises due to the large thickness of the multilayer structure, that a shutter mechanism is required for the filter, and that EL energy is absorbed by the inserted color filter.

Patent Publication No. JP-A-1981-62284 describes another two-dimensional organic EL display unit wherein a plurality of one-dimensional EL arrays each disposed on a stripe supporting substrate are arranged by adhesion to obtain a two-dimensional display unit. In the proposed display unit, however, the display unit has similar defects of degradation in the image quality because of the scattering in the luminescence. Further, both the latter display units have similar defects of a low brightness in the screen because of the small cell area, especially in the case of a fine cell.

SUMMARY OF THE INVENTION

In view of the above, it is an object of the present invention to provide an improved organic thin film EL display unit capable of reducing scattering of the EL cells, improving the contrast, and alleviating the reduction of the luminescence accompanied by miniaturization of the cells, and especially suited for a color display unit.

In accordance with the present invention, there is provided a two-dimensional organic thin film electroluminescent (EL) display unit comprising a supporting substrate and a plurality of one-dimensional organic EL arrays overlying the supporting substrate and arranged in a first direction, the organic EL arrays including a transparent substrate having a main surface directed to the first direction and a multilayer structure overlying the main surface, the multilayer structure including a plurality of first layer stripe electrodes extending parallel to one another, at least one organic EL film overlying the first layer electrodes, and a second layer stripe electrode overlying the organic EL film and extending perpendicular to the first layer stripe electrodes, each of the organic EL arrays including a plurality of EL cells arranged in a second direction perpendicular to the first direction, each of the first layer stripe electrodes and second layer stripe electrode driving the EL cells to emit luminescence in a third direction perpendicular to the first and second directions.

In accordance with the two-dimensional organic EL display unit, since the multilayer structure in each cell is deposited perpendicular to the direction of emission of the luminescence, defects or scattering of the luminescence less degrade the image quality or contrast. Further, the cell area for luminescence can be increased in the direction parallel to the mission of the luminescence without increasing the cell size in the screen of the display unit, thereby enhancing the rightness per unit area in the screen.

DESCRIPTION OF THE PREFERRED EMBODIMENTS

Figure 1:
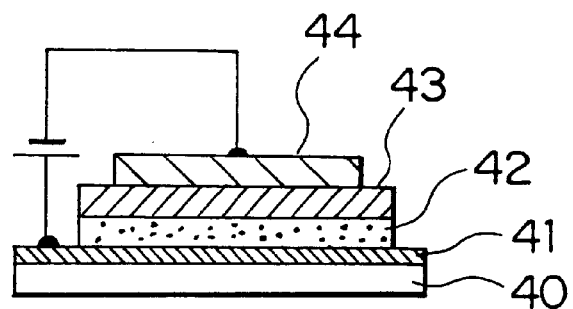
FIG. 1 is a cross-section of a general arrangement of an organic thin film EL display unit.
Figure 2:
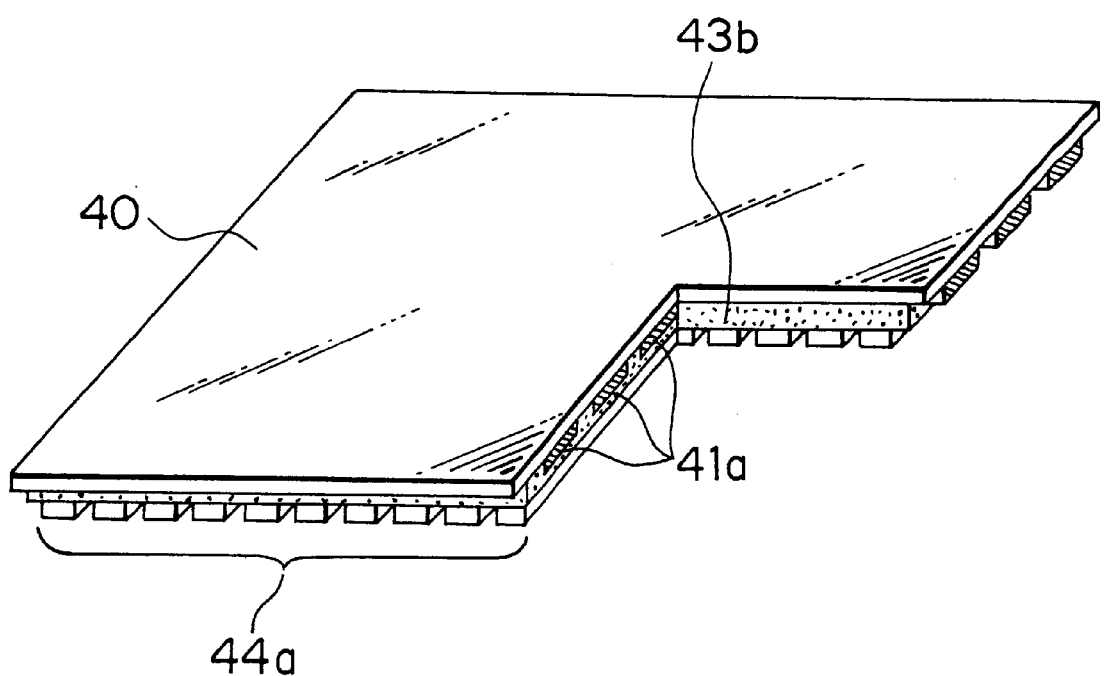
FIG. 2 is a perspective view of a conventional two-dimensional organic thin film EL display unit.
Figure 3:
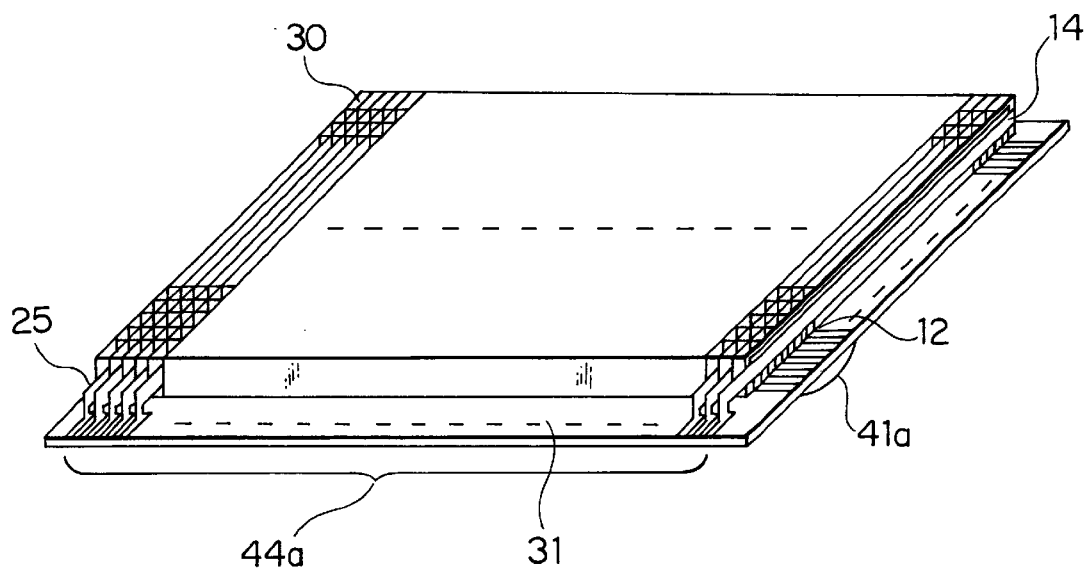
FIG. 3 is perspective view of an organic thin film EL display unit according to an embodiment of the present invention.

FIG. 3 shows an organic thin film EL display unit according to an embodiment of the present invention. The EL display unit is fabricated by arranging and adhering 101 in number of one-dimensional EL arrays 30 together in the direction perpendicular to the direction of the EL arrays 30 and perpendicular to the main surface of the transparent substrate of the EL array 30. Each of the EL array 30 includes 64 EL cells for emitting EL from a first side surface of the EL array 30 in the upward direction as viewed in the drawing. A lead electrode 25 is provided for driving a corresponding EL array 30 at the interface between the EL array 30 and the adjacent EL array 30, the lead electrode 25 being disposed in an electric contact with metallic electrodes 14 in the EL cells. Thus, 100 lead electrodes 25 constituting an electrode group (second electrode group) 44a are disposed between the 101 EL arrays 30.

64 stripe transparent electrodes 12 are adhered to a supporting substrate 31 having 64 stripe patterns printed thereon so that corresponding rows in the EL arrays 30 are connected together at the second side surface of the EL array 30 opposed to the first side surface, to thereby form an electrode group (first electrode group) 41a. A scanning circuit (not shown) is connected to the first electrode group 41a for providing positive shift pulses to the 64 transparent electrodes 12, whereas an image data output circuit is connected to the second electrode group 44a for providing negative image data pulses to the second electrode group 44a in synchronism with the scanning positive pulses, thereby obtaining a two-dimensional monochrome display unit having a 100 (horizontal)×64 (vertical) EL cells.

Figure 4:
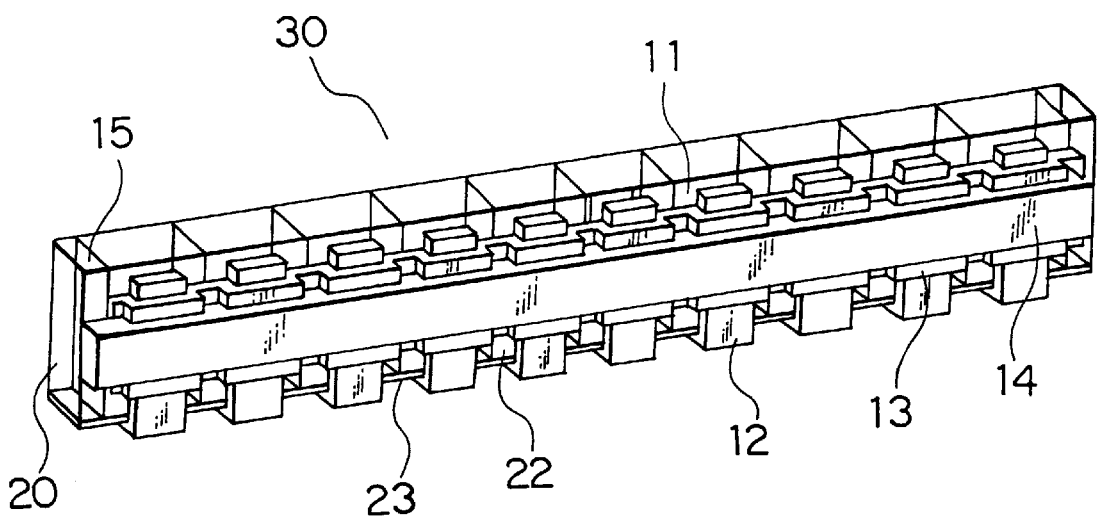
FIG. 4 is a detailed perspective view of the one-dimensional organic EL array shown in the organic this film EL display unit of FIG. 3.

FIG. 4 shows the details of the one-dimensional organic thin film EL array 30 shown in FIG. 3. The one-dimensional EL array 30 has a 100 mm long×10 mm wide×1 mm thick transparent substrate 20, separated by light reflecting separators 15 in the direction of the array. The separators 15 are disposed within the transparent substrate 20 at a constant pitch of 1.5 mm. The bottom surface of the transparent substrate 20 called the second side surface 23 herein is coated with a black insulating paint to form a black layer 22. On the main surface of the transparent substrate 20 on which the multilayer EL cells are formed and the black layer 22, there are provided 64 stripe transparent electrodes 12 made of sputtered indium oxide and extending from the main surface to the black layer 22 in parallel with one another.

The transparent electrodes 12 are 1 mm wide and arranged alternately with the light reflecting separator 15 at a constant pitch. A 50 nm-thick organic hole transport layer made of 1,1-bis-(4-diparatrilaminophenyl) cyclohexane and a 70 nm-thick organic EL thin film made of tris(8-quinolinol) aluminum are deposited by a vacuum sputtering technique to form an organic multilayer structure 13, followed by vacuum evaporation of a 7 mm-wide metallic electrode 14 made of Al—Li alloy along the elongate side of the transparent substrate 20, thereby finishing a one-dimensional EL array for generating yellow-green luminescence.

When power is supplied between the anode formed by the stripe transparent electrode 12 and the cathode formed by the metallic electrode 14 in the one-dimensional array 30, the organic EL thin film in the organic multilayer structure 13 constituting the one-dimensional cell array generates yellow-green luminescence at the 64 crossing portions formed by and interposed between the stripe transparent electrodes 12 and the metallic electrode 14. Each of the cell forms 1 mm×7 mm rectangle. The luminescence emitted from each cell is reflected by the metallic electrode 14 to be incident on the transparent substrate 20 and does not diffuse to the adjacent cells because the light reflecting separator 15 disposed within the transparent substrate 20 separates the luminescence between the cells.

Figure 5:
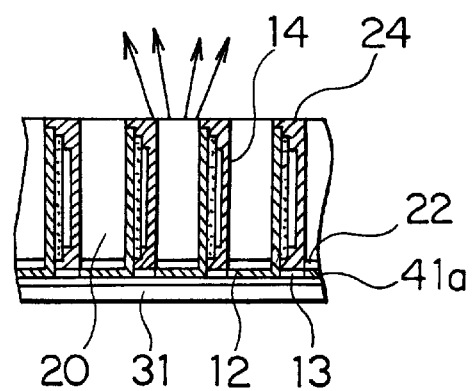
FIG. 5 is a cross-sectional view of the two-dimensional organic EL display unit of FIG. 3.

FIG. 5 shows a cross-section at the central portion of the organic thin film EL display unit of FIG. 3. In the display unit, since it is formed by a plurality of one-dimensional luminescent arrays 30 adhered in the direction perpendicular to the array, the luminescence incident on the transparent substrate 20 from each cell is reflected also by the metallic electrodes 14 of the adjacent array to be emitted as the luminescence from the specific cell through the first side surface of the transparent substrate 20, which forms an optical open end of each cell. In this embodiment, although the equivalent luminescent area of each cell in the screen is 1 mm wide, which is equal to the thickness of the transparent substrate 20, and 1 mm long, which is equal to the width of the transparent electrode 12, the cell area which functions as a luminescent area for this specific cell equals 1 mm×7 mm which is seven times as large as a conventional cell area in the screen. The brightness of the luminescence per cell at the first side surface equaled 3 times as large as the brightness of a conventional 1 mm wide and 1 mm long cell. The reason for the 3 times and not 7 times is due to the absorption of the luminescence within the transparent substrate 20.

Other one-dimensional cell for EL of other colors are obtained by doping a small amount of fluorescent material into other organic multilayer structures such as described above. One-dimensional arrays for blue-green luminescence and red-orange luminescence were exemplarily obtained by doping the organic EL multilayer with coumalin and DCM (4-(Dicyanomethylene)-2-methyl-6-(p-dimethylaminostyryl)-4H-pyran), respectively, and combined with the yellow-green luminescence one-dimensional array as described above by consecutively adhering the three color arrays in succession to form a two-dimensional color display unit.

Figure 6:
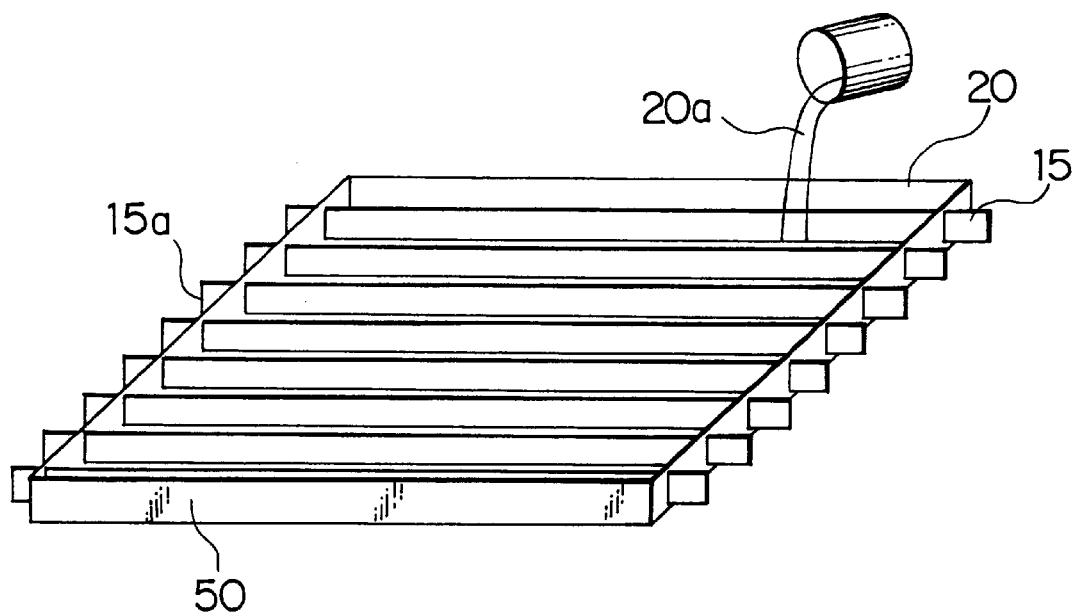
FIG. 6 is a perspective view for showing a method for manufacturing the transparent substrate shown in FIG. 4.

FIG. 6 shows a method employed by us for forming the transparent substrate 20 of the organic thin film EL display unit of FIG. 3. The transparent substrate 20 was obtained by arranging a plurality of 1 mm-wide aluminum foil ribbon in parallel to one another within a mold or die 50 at a constant pitch of 1.5 mm, pouring polycarbonate resin into the mold 50, solidifying the same to form a plurality of 1 mm-thick stripe polycarbonate, and forming a 10 mm-wide stripe substrate 20 by cutting.

Figure 7:
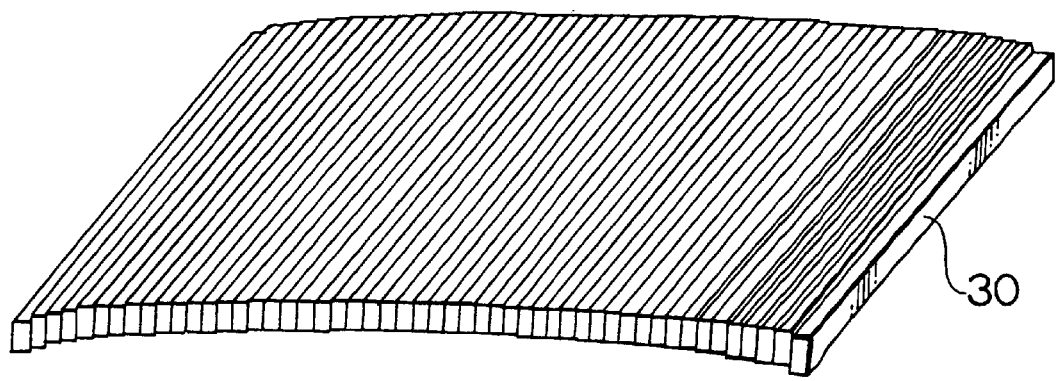
FIGS. 7 to 9 are perspective views of the screen of the organic thin film EL display unit according to other embodiments of the present invention.

FIG. 7 shows a configuration of the screen of an organic thin film EL display unit according to another embodiment of the present invention. The EL display unit of FIG. 7 has a curved or slightly stepped screen. The curved screen can be obtained by adhering a plurality of one-dimensional EL arrays 30, with the first side surface of the one-dimensional arrays 30 being increasingly slipped off in the direction normal to the screen, especially greater at the horizontal edge portions of the screen. The configuration of the screen in the organic EL display unit is similar to that of a CRT display unit.

Figure 8:
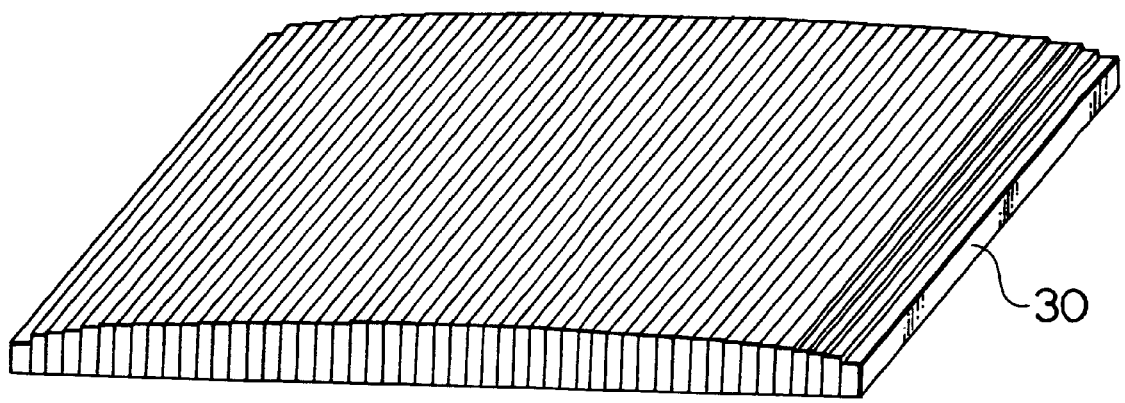

FIG. 8 shows another curved configuration in the screen of an organic thin film EL display unit. The curved surface can be obtained by a different widths of the one-dimensional EL arrays 30, which provide a curved or slightly stepped surface at the screen of the display unit, similarly to the slip-off of the one-dimensional arrays in the displayunit of FIG. 7. The display units as shown in FIGS. 7 and 8 may have a smoothed surface at the screen by coating a specific resin at the stepped portions of the screen for smoothing.

Figure 9:
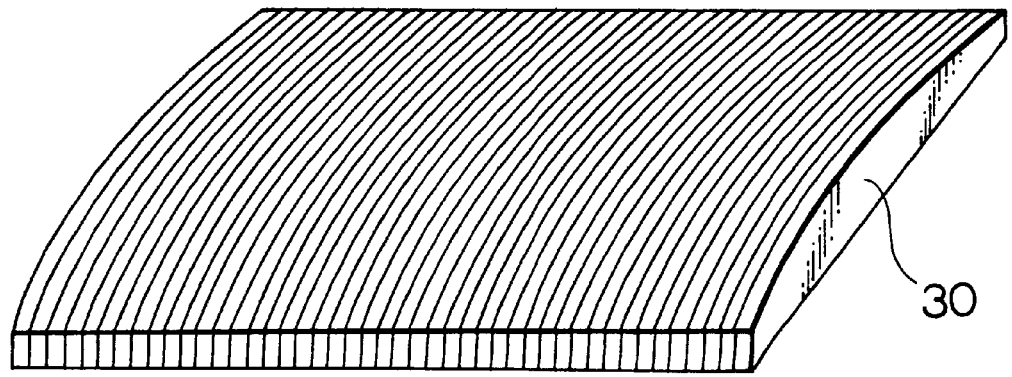

FIG. 9 shows another configuration of the curved surface of the screen in a display unit. The curved surface can be obtained by a curved first side surface in each of the one-dimensional EL array 30 which provides different widths of the array as viewed along the direction of the array, specifically by a large width center, a small width ends and smoothly tapered bridge portions of the array 30.

Although the present invention is described with reference to preferred embodiments thereof, the present invention is not limited thereto and it will be apparent from those skilled in the art that various modifications or alterations can be easily made therefrom without departing from the scope of the present invention as set forth in the appended claims.

What is claimed is:

1. A two-dimensional organic thin film electroluminescent (EL) display unit comprising:

a supporting substrate and a plurality of one-dimensional organic EL arrays overlying said supporting substrate and arranged in a first direction, wherein said organic EL arrays including a transparent substrate having a main surface facing in said first direction and a multilayer structure overlying said main surface, said multilayer structure including a plurality of first layer stripe electrodes extending parallel to one another, at least one organic EL film overlying said first layer electrodes, and a second layer stripe electrode overlying said organic EL film and extending perpendicular to said first layer stripe electrodes, each of said organic EL arrays including a plurality of EL cells arranged in a second direction perpendicular to said first direction, and each of said first layer stripe electrodes and second layer stripe electrode driving said EL cells to emit luminescence in a third direction perpendicular to said first and second directions.

2. A two-dimensional organic thin film electroluminescent (EL) display unit comprising:

a supporting substrate and a plurality of one-dimensional organic EL arrays overlying said supporting substrate and arranged in a first direction, wherein said organic EL arrays including a transparent substrate having a main surface facing in said first direction and a multilayer structure overlying said main surface, said multilayer structure including a plurality of first layer stripe electrodes extending parallel to one another, at least one organic EL film overlying said first layer electrodes, and a second layer stripe electrode overlying said organic EL film and extending perpendicular to said first layer stripe electrodes, each of said organic EL arrays including a plurality of EL cells arranged in a second direction perpendicular to said first direction, and each of said first layer stripe electrodes and second layer stripe electrode driving said EL cells to emit luminescence in a third direction perpendicular to said first and second directions, wherein each of said transparent substrates has therein a plurality of separators for reflecting luminescence to separate said EL cells from one another.

3. A two-dimensional organic thin film display unit as defined in claim 1, wherein each adjacent two of said organic EL arrays are bonded together.

4. A two-dimensional organic thin film display unit as defined in claim 1, wherein said first layer stripe electrodes and second layer stripe electrode are transparent and metallic, respectively.

5. A two-dimensional organic thin film display unit as defined in claim 1, wherein said organic EL array has a black layer directed to a direction opposite to said third direction.

6. A two-dimensional organic thin film display unit as defined in claim 1, wherein said first layer stripe electrodes and second layer stripe electrode drive said EL cells in a matrix drive.

7. A two-dimensional organic thin film display unit as defined in claim 1, wherein said organic EL arrays include a plurality of combinations of EL arrays, each of said combinations generating luminescence of three primary colors.

8. A two-dimensional organic thin film EL display unit as defined in claim 1, wherein said display unit has a curved screen.

9. A two-dimensional organic thin film EL display unit as defined in claim 1, wherein said plurality of said first layer strip electrodes extend in said first direction.

10. A two-dimensional organic thin film EL display unit as defined in claim 1, wherein said second layer strip electrode extends in said second direction.

* * * * *